(12) United States Patent
Chung

(10) Patent No.: US 6,946,400 B2
(45) Date of Patent: Sep. 20, 2005

(54) PATTERNING METHOD FOR FABRICATING INTEGRATED CIRCUIT

(75) Inventor: Henry Chung, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 105 days.

(21) Appl. No.: 10/249,143

(22) Filed: Mar. 19, 2003

(65) Prior Publication Data

US 2004/0121597 A1 Jun. 24, 2004

(30) Foreign Application Priority Data

Dec. 24, 2002 (TW) ........................................ 91137112 A

(51) Int. Cl.[7] .............................................. H01L 21/302
(52) U.S. Cl. ..................... 438/706; 438/707; 438/708; 438/709; 438/717; 438/718; 438/720
(58) Field of Search ................................ 438/706, 708, 438/709, 717, 718, 720

(56) References Cited

U.S. PATENT DOCUMENTS 5,895,740 A * 4/1999 Chien et al. ............... 430/313
6,416,933 B1 * 7/2002 Singh et al. ............... 430/313
6,451,705 B1 * 9/2002 Trapp et al. ............... 438/723

* cited by examiner

Primary Examiner—Nadine G. Norton
Assistant Examiner—Binh X. Tran
(74) Attorney, Agent, or Firm—Jianq Chyun IP Office

(57) ABSTRACT

A patterning method for fabricating integrated circuits. The method includes forming a material layer over a substrate and then forming a photoresist layer over the material layer. The photoresist layer has a thickness small enough to relax the limitations when the photoresist layer is patterned in a photolithographic process. A shroud liner is formed over the photoresist layer such that height of the shroud liner is significantly greater than width of the shroud liner. Thereafter, the shroud liner undergoes a processing treatment to remove the sections attached to the sidewalls of the photoresist layer. Using the remaining shroud liner as an etching mask, an etching operation is carried out to pattern the material layer.

15 Claims, 4 Drawing Sheets

US 6,946,400 B2

PATTERNING METHOD FOR FABRICATING INTEGRATED CIRCUIT

CROSS REFERENCE TO RELATED APPLICATIONS

This application claims the priority benefit of Taiwan application serial no. 91137112, filed Dec. 24, 2002.

BACKGROUND OF INVENTION

1. Field of Invention

The present invention relates to a patterning method for fabricating integrated circuit. More particularly, the present invention relates to a patterning method capable of minimizing some limitations in photolithographic and etching processes.

2. Description of Related Art

As dimensions of semiconductor devices continue to shrink, the demand for resolution goes up correspondingly. Because the resolution of a photolithographic process is dependent upon wavelength of a light source used in the photo-exposure, the mask patterns obtained by conducting a photolithographic (or together with an etching) process must be separated from each other by a minimum distance. Furthermore, if the mask is used as an etching mask, gap or opening dimension in the etching mask can hardly be reduced without some adverse effect on the underlying layer waiting to be etched.

At present, the photolithographic process for patterning a photoresist layer is set such that gaps or openings in the photoresist layer have a minimum aspect ratio of 3:1. However, the photoresist layer must also have a thickness sufficient to resist etching. Hence, miniaturization of device can hardly be achieved by reducing thickness of the photoresist layer directly.

To reduce thickness of photoresist layer, a hard mask layer fabricated using a material of higher etch resistance is often employed as etching mask. In other words, the method includes using a photoresist layer to pattern a hard mask layer and then using the hard mask layer as an etching mask to pattern a material layer underneath. Because of etching selectivity between the hard mask layer and the underlying material layer, a hard mask layer with lesser thickness can be used. This relaxes the thickness requirement of photoresist layer and hence eases up some of the limitations in a photolithographic process. Yet, this method has some serious drawbacks. First, material forming the hard mask layer must be specifically selected in accordance with the material properties of the material layer to be patterned. Hence, a different hard mask layer must be used to pattern a material layer made from a different material and hence the complexity of processing design is increased. Secondly, because the hard mask layer and the photoresist layer must be made from two different materials, the photoresist layer and the hard mask layer must be removed in at least two separate steps and hence the complexity the fabrication is more complex and, thus, more costly.

SUMMARY OF INVENTION

Accordingly, one object of the present invention is to provide a patterning method for fabricating integrated circuits that can relax some of the limitations in a photolithographic process.

A second object of this invention is to provide a patterning method for fabricating integrated circuits that resolves some of the drawbacks caused by using a hard mask layer in the conventional method.

To achieve these and other advantages and in accordance with the purpose of the invention, as embodied and broadly described herein, the invention provides a patterning method for fabricating integrated circuits. First, a material layer is formed over a substrate and then a photoresist layer is formed over the material layer. The photoresist layer has a thickness small enough to relax the limitations when the photoresist layer is patterned in a photolithographic process. The dimensions of the patterned photoresist are the critical dimension. Next, a shroud liner is formed over the photoresist layer such that height of the shroud liner is greater than width of the shroud liner. In other words, thickness of the shroud liner above the uppermost surface of the photoresist layer is thicker than thickness of the shroud liner on the sidewall of the patterned photoresist layer. In this invention, the shroud liner is made from a polymeric compound, which formed by plasma-enhanced chemical vapor deposition (PECVD), for example. Thereafter, the part of shroud liner on the sidewalls of the photoresist layer is removed. Using the remaining shroud liner as an etching mask, an etching operation is carried out to pattern the material layer. Finally, the shroud liner and the photoresist layer are removed together.

This invention also provides an alternative patterning method for fabricating integrated circuits. First, a material layer is formed over a substrate and then a photoresist layer is formed over the material layer. The photoresist layer has a thickness large enough to relax the photolithographic limitations. Furthermore, the dimensions of the photoresist layer are smaller than the targeted critical dimensions. Thereafter, a shroud liner is formed over the photoresist layer such that the dimensions of the shroud liner on the photoresist layer match the target critical dimensions. In this invention, the shroud liner is a polymeric compound and formed by plasma-enhanced chemical vapor deposition (PECVD), for example. Thereafter, the part of the shroud liner on the sidewalls of the photoresist layer is removed. Using the remaining shroud liner as an etching mask, an etching operation is carried out to pattern the material layer. Finally, the shroud liner and the photoresist layer are removed together.

In this invention, a thinner photoresist layer is fabricated so that the limitations in photolithographic process due to device miniaturization are eased. Although the photoresist layer is too thin to resist etching, the shroud liner rather than the photoresist layer actually serves as as etching mask. Hence, the method is able to relax the limitations in a photolithographic process and to miniaturize devices at the same time.

Furthermore, the shroud liner on the surface of the photoresist layer is made from a polymer compound similar to the organic polymer material used for photoresist layer. Therefore, unlike in a conventional method whose hard mask layer must be specifically selected for a chosen material layer, the shroud liner can be widely used as an etching mask for many material layers.

In addition, the shroud liner and the photoresist layer are made of similar type of organic polymer compound. Unlike in a conventional method whose photoresist layer and hard mask layer must be removed in separate steps, the photoresist layer and the shroud liner can be removed together after the material layer is patterned.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
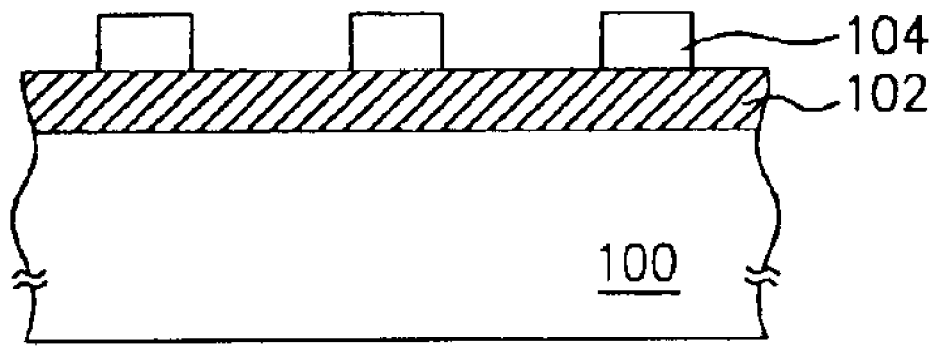
FIGS. 1A to 1D are schematic cross-sectional views showing a series of steps carried out to pattern an integrated circuit according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1D are schematic cross-sectional views showing a series of steps carried out to pattern an integrated circuit according to one preferred embodiment of this invention. As shown in FIG. 1A, a material layer 102 is formed over a substrate 100. The material layer 102 is a dielectric layer (for example, a silicon oxide layer, a silicon nitride layer or a silicon oxy-nitride layer) or a conductive layer (for example, a metallic layer or a polysilicon layer). A patterned photoresist layer 104 is formed over the material layer 104. The photoresist layer 104 has a thickness sufficiently small to enhance the resolution in the photolithographic process when the photoresist layer is patterned.

Figure 1B:
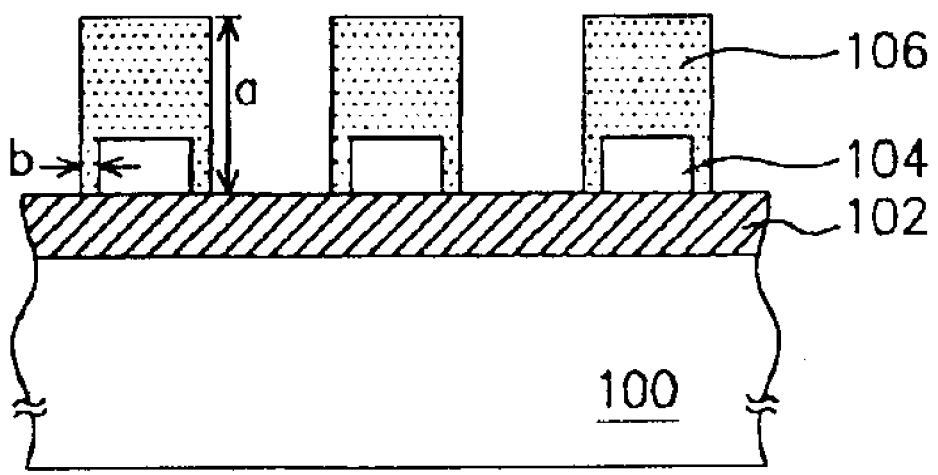

As shown in FIG. 1B, a shroud liner 106 is formed on the surface of the photoresist layer 104. The shroud liner 106 has a height "a" greater than its width "b". In other words, thickness of the shroud liner 106 above the upper surface of the photoresist layer 104 is considerably greater than thickness of the shroud liner 106 on the sidewalls of the photoresist layer 104.

In this embodiment, the shroud liner 106 is made, for example, from a polymer material. The shroud liner 106 is formed, for example, by conducting a plasma-enhanced chemical vapor deposition (PECVD). In the PECVD, reactive gases having a chemical formula $C_xF_y$ and $CH_mF_n$ (where x, y, m, n are integers) are used. Specifically, The PECVD is carried out using reactive gases containing, for example, difluoro-methane ($CH_2F_2$) or a mixture of difluoro-methane ($CH_2F_2$) and octo-fluoro butane ($C_4F_8$) or a mixture of difluoro-methane ($CH_2F_2$) and trifluoro-methane. The PECVD is carried out at a pressure between 1~100 mTorr with a power rating set between 500~2000 W and a bias voltage between 0~400V is often applied during the deposition process. The rate of deposition is between 600~600/min, for example. In addition, some argon (Ar), carbon monoxide (CO), oxygen ($O_2$) and nitrogen ($N_2$) may also be added to the reactive gases during the PECVD.

Figure 1C:
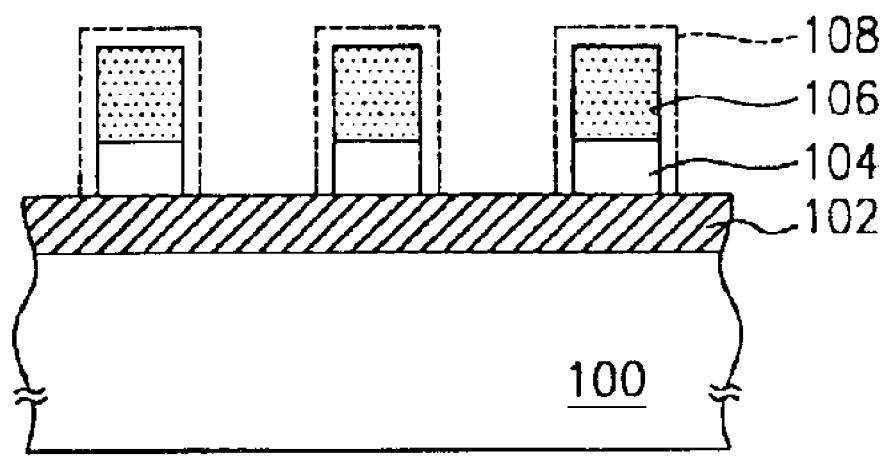

As shown in FIG. 1C, the shroud liner 106 is processed to remove the shroud liner 106 material from the sidewalls of the photoresist layer 104. Processing treatment of the shroud liner 106 includes applying plasma to etch away a layer of material from the shroud liner 106. The original profile of the shroud liner 106 before plasma treatment is shown in dashed outline 108. In the plasma treatment, a finite layer of the shroud liner material on top of the photoresist layer 104 will also be removed aside from the shroud liner material trimmed away from the sidewall of the photoresist layer 104. It is to be noted that because height "a" of the shroud liner 106 is considerably greater than its width "b", the remaining shroud liner 106 above the photoresist layer 104 after the plasma treatment is still of considerable thickness to resist etching.

Figure 1D:
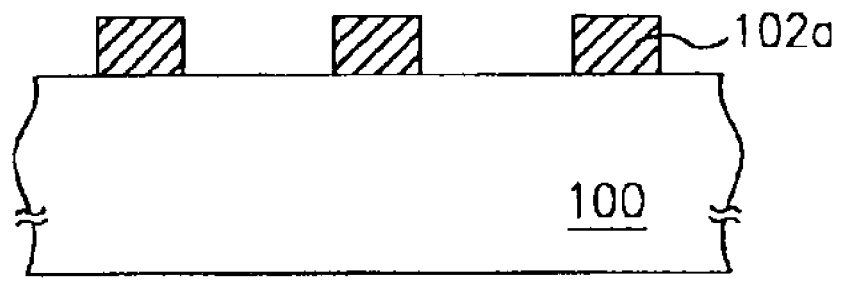

Thereafter, using the trimmed shroud liner 106 as etching mask, an etching operation is conducted to pattern the material layer 102a. Finally, the shroud liner 106 and the photoresist layer 104 are removed to form the structure as shown in FIG. 1D. Since the shroud liner 106 and the photoresist layer 104 are made from similar organic polymer material, the shroud liner 106 and the photoresist layer 104 can be removed in a single step.

In this embodiment, the photoresist layer 104 is purposely made thinner to relax the limitations in a photolithographic process resulting from patterning a thick photoresist layer 104. Although the photoresist layer 104 is too thin to resist the subsequent etching, the shroud liner 106 rather than the photoresist layer 104 is actually used as etching mask for patterning the material layer 102. Hence, the invention is able to relax some of the limitations in photolithographic and etching process and enhances the reduction of device dimensions accordingly.

Figure 2A:
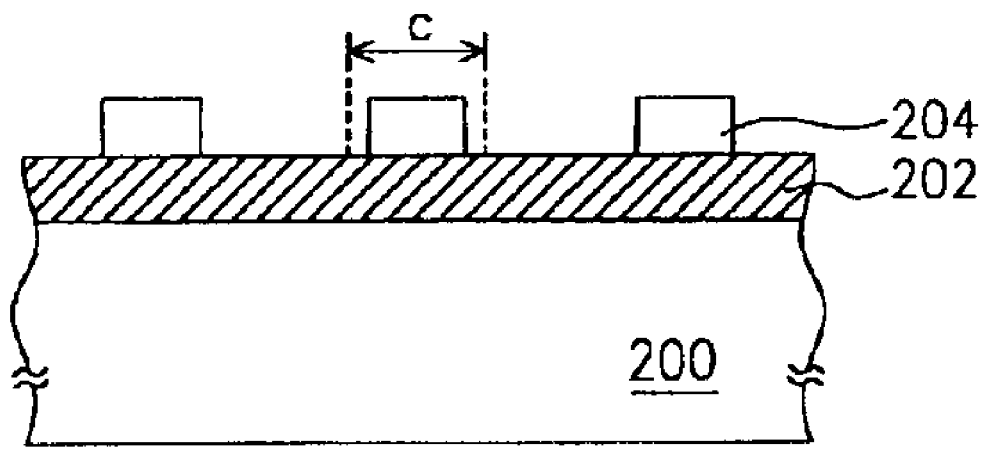
FIGS. 2A to 2C are schematic cross-sectional views showing a series of steps carried out to pattern an integrated circuit according to another preferred embodiment of this invention.
Figure 2B:
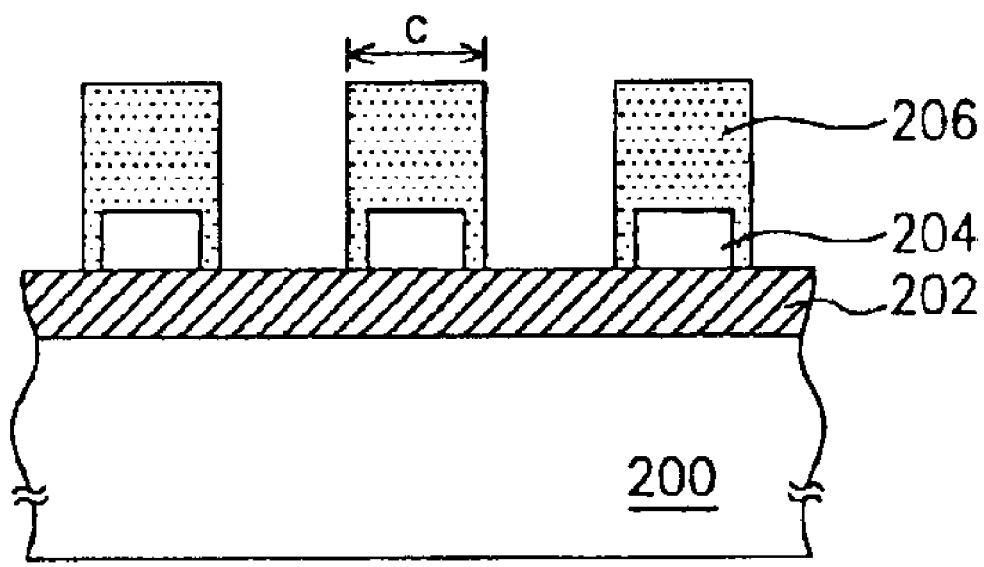
Figure 2C:
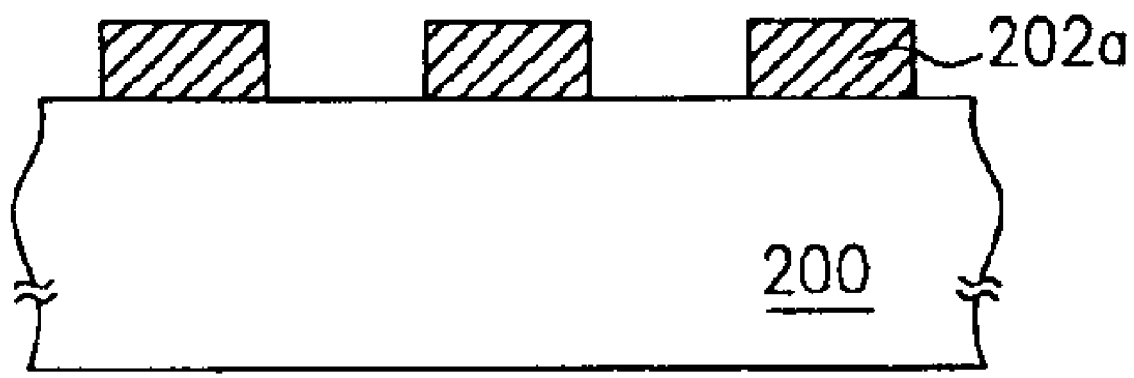

FIGS. 2A to 2C are schematic cross-sectional views showing a series of steps carried out to pattern an integrated circuit according to another preferred embodiment of this invention. As shown in FIG. 2A, a material layer 202 is formed over a substrate 200. The material layer 202 is a dielectric layer (for example, a silicon oxide layer, a silicon nitride layer or a silicon oxy-nitride layer) or a conductive layer (for example, a metallic layer or a polysilicon layer). A patterned photoresist layer 204 is formed over the material layer 204. The photoresist layer 204 has a thickness sufficiently small to relax the limitations in a photolithographic process when the photoresist layer is patterned. Furthermore, the width of the photoresist layer 204 is smaller than the critical dimension "c" of a device.

As shown in FIG. 2B, a shroud liner 206 is formed over the photoresist layer 204. The shroud liner 206 is fabricated with a width that matches the critical dimension "c" of the device closely. In other words, the width of the shroud liner 206 preferably coincides with the critical dimension "c" of the device.

In this embodiment, the shroud liner 206 is, for example, a polymeric material. The shroud liner 206 is formed, for example, by plasma-enhanced chemical vapor deposition (PECVD). In the PECVD, reactive gases having a chemical formula $C_xF_y$ and $CH_mF_n$ (where x, y, m, n are integers) are used. Since a process of using PECVD to form a shroud liner as in the first embodiment is used, a detailed description is not repeated here.

Thereafter, using the trimmed shroud liner 206 as etching mask, etching is conducted to pattern the material layer 202 into a material layer 202a. Finally, the shroud liner 206 and the photoresist layer 204 are removed to produce the structure as shown in FIG. 2C. Since the shroud liner 206 and the photoresist layer 204 are made from similar organic polymer is material, the shroud liner 206 and the photoresist layer 204 can be removed together in a single step.

In the aforementioned second embodiment, the photoresist layer 204 is purposely made thinner to relax the limitations in a photolithographic process resulting from patterning a thick photoresist layer 204. Although the photoresist layer 204 is too thin to resist subsequent etching, the shroud liner 206 rather than the photoresist layer 204 is actually used as etching mask for patterning the material layer 202. Hence, the invention is able to relax some of the limitations in photolithographic and etching process as and to enable reducing device dimensions accordingly. In addition, width of the shroud liner 206 is also purposely made to match the critical dimension "c" of a device. Since the critical dimensions of a semiconductor device are very important in the fabrication of semiconductor, a number of methods for controlling critical dimension have been developed. In this invention, critical dimension of the device is controlled by the growth of the shroud liner 206. The method not only controls the critical dimensions but is also easy to implement.

In summary, major advantages of this invention includes:

1. A thin photoresist layer is used to relax the limitations in photolithographic process encounter in device miniaturization. Although the thickness of the photoresist layer is now insufficient to resist in the subsequent etching, the shroud liner provides the etch resistance in patterning the material layer. Hence, the invention is able to relax some of the limitations in photolithographic and etching process as and enables the reduction of device dimensions.

2. The shroud liner on the surface of the photoresist layer is made from a polymer compound similar to the organic polymer material used for the photoresist layer. Therefore, unlike a conventional method whose hard mask layer must be carefully selected to match the material layer, the shroud liner can be used as etching mask for mucj more material layers.

3. The shroud liner and the photoresist layer are made from similar type of organic polymeric compound. Unlike a conventional method whose photoresist layer and hard mask layer must be removed in separate steps, the photoresist layer and the shroud liner can be removed together after the material layer is patterned.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A patterning method for fabricating an integrated circuit, comprising the steps of:

providing a substrate;

forming a material layer over the substrate;

forming a photoresist layer over the material layer;

forming a shroud liner over the photoresist layer, wherein a thickness of the shroud liner above an upper surface of the photoresist layer is greater than a thickness of the shroud liner on sidewalls of the photoresist layer;

removing a layer of the shroud liner from the sidewalls of the photoresist layer such that a portion of the shroud liner remains on the upper surface of the photoresist layer; and conducting an etching operation to pattern the material layer using the shroud liner as an etching mask.

2. The method of claim 1, wherein the photoresist layer is formed thin to increase resolution of a photolithographic process when the photoresist layer is patterned, wherein a thickness of the photoresist layer is insufficient to resist in a subsequent etching.

3. The method of claim 1, wherein material constituting the shroud liner includes a polymeric compound.

4. The method of claim 1, wherein the material layer includes a dielectric layer or a conductive layer.

5. The method of claim 1, wherein the step of processing the shroud liner includes a plasma treatment process.

6. The method of claim 1, wherein after the step of patterning the material layer, further includes removing the shroud liner and the photoresist layer together in the same process.

7. The method of claim 1, wherein the shroud liner is formed by conducting a plasma-enhanced chemical vapor deposition process.

8. The method of claim 7, wherein the plasma-enhanced chemical vapor deposition process is carried out using a reactive gas or a mixture of reactive gases with chemical formula $C_xF_y$ and $CH_mF_n$ where x, y, m and n are positive integers.

9. A patterning method for fabricating an integrated circuit, comprising the steps of:

providing a substrate;

forming a material layer over the substrate;

forming a photoresist layer over the material layer, wherein dimension of the photoresist layer is smaller than the critical dimension of a device;

forming a shroud liner over the photoresist layer, wherein dimension of the shroud liner matches the critical dimension of the device closely, and a thickness of the shroud liner above an upper surface of the photoresist layer is greater than a thickness of the shroud liner on sidewalls of the photoresist layer; and conducting an etching operation to pattern the material layer using the shroud liner as an etching mask.

10. The method of claim 9, wherein the photoresist layer is formed thin to increase resolution of a photolithographic process when the photoresist layer is patterned, wherein a thickness of the photoresist layer is insufficient to resist in a subsequent etching.

11. The method of claim 9, wherein material constituting the shroud liner includes a polymer compound.

12. The method of claim 9, wherein the material layer includes a dielectric layer or a conductive layer.

13. The method of claim 9, wherein after the step of patterning the material layer, further includes removing the shroud liner and the photoresist layer together in the same process.

14. The method of claim 9, wherein the shroud liner is formed by conducting a plasma-enhanced chemical vapor deposition process.

15. The method of claim 14, wherein the plasma-enhanced chemical vapor deposition process is carried out using a reactive gas or a mixture of reactive gases with chemical formula $C_xF_y$ and $CH_mF_n$ where x, y, m and n are positive integers.

* * * * *